(12) United States Patent
Horng et al.

(10) Patent No.: US 10,969,097 B2
(45) Date of Patent: Apr. 6, 2021

(54) FAN

(71) Applicant: Sunonwealth Electric Machine Industry Co., Ltd., Kaohsiung (TW)

(72) Inventors: Alex Horng, Kaohsiung (TW); Chia-Ching Tsai, Kaohsiung (TW); Hung-Cheng Zhou, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 159 days.

(21) Appl. No.: 16/157,200

(22) Filed: Oct. 11, 2018

(65) Prior Publication Data

US 2020/0063956 A1    Feb. 27, 2020

(30) Foreign Application Priority Data

Aug. 22, 2018  (TW) ................ 10712936.4

(51) Int. Cl.

| F21V 33/00 | (2006.01) |
| F21V 15/01 | (2006.01) |
| F21V 3/02  | (2006.01) |
| F21V 3/06  | (2018.01) |
| H05K 7/20  | (2006.01) |
| F04D 29/32 | (2006.01) |
| F21Y 105/18 | (2016.01) |
| F21Y 115/10 | (2016.01) |

(52) U.S. Cl.
CPC ........ F21V 33/0096 (2013.01); F04D 29/329 (2013.01); F21V 3/02 (2013.01); F21V 3/0625 (2018.02); F21V 15/01 (2013.01); F21V 33/0092 (2013.01); H05K 7/20172 (2013.01); F21Y 2105/18 (2016.08); F21Y 2115/10 (2016.08)

(58) Field of Classification Search
CPC .. F21V 33/00; F21V 33/0088; F21V 33/0092; F21V 33/0096
See application file for complete search history.

(56) References Cited

U.S. PATENT DOCUMENTS

| 5,567,045 | A  | * | 10/1996 | Bucek  | F21V 3/00 |
|           |    |   |         |        | 362/363   |
| 6,398,381 | B1 | * | 6/2002  | Tseng  | A61L 9/12 |
|           |    |   |         |        | 362/234   |
| 8,092,155 | B2 |   | 1/2012  | Tsen   |           |
| 9,777,918 | B1 | * | 10/2017 | Wen    | F21V 17/06 |

FOREIGN PATENT DOCUMENTS

| CN | 2620788 Y   | 6/2004  |
| CN | 201661493 U | 12/2010 |
| CN | 205895650 U | 1/2017  |
| CN | 206206210 U | 5/2017  |

(Continued)

*Primary Examiner* — David Hamaoui
*Assistant Examiner* — Brian O Peters
(74) *Attorney, Agent, or Firm* — Alan D. Kamrath; Karin L. Williams; Mayer & Williams PC

(57) ABSTRACT

A fan includes a fan frame, an impeller, a plurality of blades and a light emitting unit. The impeller is rotatably coupled with the fan frame and includes a light diffuser ring. The plurality of blades is connected to the light diffuser ring. The light emitting unit is mounted in the fan frame, includes a board and plurality of light-emitting elements mounted on the board, and shines light on the light diffuser ring.

16 Claims, 14 Drawing Sheets

(56) References Cited

FOREIGN PATENT DOCUMENTS

| | | |
|---|---|---|
| CN | 107355394 A | 11/2017 |
| TW | M344460 U | 11/2008 |
| TW | M530978 U | 10/2016 |
| TW | M539086 U | 4/2017 |
| TW | I601882 A | 10/2017 |

\* cited by examiner

FAN

CROSS REFERENCE TO RELATED APPLICATION

The application claims the benefit of Taiwan application serial No. 107129364, filed on Aug. 22, 2018, and the entire contents of which are incorporated herein by reference.

BACKGROUND OF THE INVENTION

1. Field of the Invention

The present invention generally relates to a fan and, more particularly, to a fan which is able to generate an appealing light effect.

2. Description of the Related Art

In addition to providing the cooling function, the conventional cooling fan further includes a plurality of light-emitting diodes (LEDs) that generates an appealing light effect during the operation of the cooling fan, so as to provide an appealing light effect for the operation of the cooling fan. This provides a high added value of the product and increases the user's purchase intention.

The conventional fan includes a fan frame and an impeller. A plurality of light emitting elements and at least one light diffuser can be received in the fan frame. The at least one light diffuser is aligned with the light emitting elements such that the light of the light emitting elements can emit through the at least one light diffuser. The impeller can be rotatably coupled with the fan frame. In this arrangement, the light of the light emitting elements can be shone on the at least one light diffuser to generate a uniform light distribution effect instead of the spotted light distribution effect. An embodiment of such a fan is disclosed by Taiwan Patent No. M530978.

Although the fan can provide both the cooling effect and the light emitting effect, the assembly of the fan requires that the light emitting elements and the at least one light diffuser be mounted to the fan frame before the impeller can be coupled with the fan frame. Thus, the assembly is time-consuming and requires a higher labor cost. Moreover, since the at least one light diffuser is stationary in the fan frame, the portions of the light diffuser aligning with the light emitting elements will have a higher illuminance than the other portions of the light diffuser not aligning with the light emitting elements. In this situation, no matter how fast the impeller rotates, it is always difficult to produce a ring-like light pattern as if it was generated in the case of visional persistence. As a result, the light distribution is not visually uniform. Due to this, the light effect of the fan is not charming enough to the consumers who are going after the ever-changing technology.

In light of this, it is necessary to improve the conventional cooling fan.

SUMMARY OF THE INVENTION

It is therefore the objective of this invention to provide a fan which improves the convenience in assembly and produces a visually uniform light distribution effect.

It is another objective of the invention to provide a fan with a higher structural strength.

It is a further objective of the invention to provide a fan which requires a smaller amount of material for production and thereby reduces the manufacturing cost.

It is yet a further objective of the invention to provide a fan which ensures that the axial height thereof does not change.

In an aspect, a fan includes a fan frame, an impeller, a plurality of blades and a light emitting unit. The impeller is rotatably coupled with the fan frame and includes a light diffuser ring. The plurality of blades is connected to the light diffuser ring. The light emitting unit is mounted in the fan frame and shines light on the light diffuser ring.

Based on this, the fan according to the invention provides a convenient and fast assembly by coupling the plurality of blades with the light diffuser ring. The light diffuser ring can be aligned with the light emitting unit. During the rotation of the impeller, the light that is emitted through the light diffuser ring can produce a ring-like light pattern as if it was generated in the case of visional persistence. As a result, the light distribution is more visually uniform. This not only improves the convenience in assembly but also brings more business opportunities to the industry while providing a higher utility and a higher aesthetic value.

In an example, the fan frame includes a frame portion and a lateral wall portion integrally formed with the frame portion. Thus, the structural strength of the fan frame is higher.

In the example, the light emitting unit includes a plurality of light-emitting elements mounted on a board, and the board is mounted on a desk of the lateral wall portion. Thus, the structure is simple, attaining a convenient manufacture and assembly of the fan.

In the example, the fan frame includes a lateral wall portion. The lateral wall portion includes a groove. The light emitting unit emits light through the groove. Thus, the light emitting unit is concealed inside the groove to firmly couple the light emitting unit with the lateral wall portion of the impeller.

In the example, the groove and the light diffuser ring are axially aligned with each other. Thus, it is ensured that the light of the light-emitting elements can reach the light diffuser ring.

In the example, the light diffuser ring is within an axial extent of the lateral wall portion. Thus, it is ensured that the height of the fan is not increased under the arrangement of the light diffuser ring.

In the example, the light emitting unit includes a plurality of light-emitting elements mounted on a board. The fan frame includes a frame portion connected to the lateral wall portion. The board of the light emitting unit is mounted to the frame portion and is located between the lateral wall portion and the frame portion. Thus, the structure is simple, attaining a convenient manufacture and assembly of the fan.

In the example, the board of the light emitting unit is formed by a plurality of arched sections. Thus, more arched sections can be produced based on the same area of the material, thereby reducing the manufacturing cost.

In the example, the frame portion includes a support portion and the board of the light emitting unit is mounted on the support portion. Thus, the board can be securely coupled with the frame portion.

In the example, the lateral wall portion includes a hollow portion facing the plurality of light-emitting elements and intercommunicating with the groove, and the plurality of light-emitting elements is received in the hollow portion. Thus, the light of the plurality of light-emitting elements can pass through the hollow portion and the groove and then is shone on the light diffuser ring. This can avoid excessively high illuminance of the light-emitting elements that is dazzling to the user.

In the example, the lateral wall portion is mounted to the frame portion, and a portion of an outer periphery of the lateral wall portion that corresponds to the board includes a guiding portion. Thus, the convenience in assembly between the lateral wall portion and the frame portion is improved.

In the example, the groove is formed on the lateral wall portion and includes an opening facing the light diffuser ring. The light emitting unit is received in the groove. Thus, the light emitting unit can be securely coupled with the lateral wall portion, thereby protecting the light emitting unit.

In the example, a top of the lateral wall portion includes a thin wall portion delimiting an open area. The open area intercommunicates with the groove. An outer edge of the light diffuser ring extends into the open area. The groove includes an opening completely within a radial extent of the light diffuser ring. Thus, it can be ensured that the light of the light emitting unit can be properly shone on the light diffuser ring after passing through the groove.

In the example, the thin wall portion includes a plurality of notches, and the light diffuser ring includes an outer extension portion extending axially towards the light emitting unit. Thus, during the rotation of the impeller, the light of the light diffuser ring can be shone on the outer extension portion to form a repeated pattern of light of "bright-dark-bright-dark."

In the example, the fan frame includes a base and a plurality of ribs. The base is received in the frame portion. The frame portion includes a support portion surrounding the base. The plurality of ribs is connected between the base and the support portion. Thus, the support portion can be securely fixed with respect to the outer periphery of the support portion.

In the example, the fan further includes a circuit board and a plurality of light emitters mounted on the circuit board. The circuit board is mounted on the base. The impeller includes a hub connected to the plurality of blades. The hub is light-permeable and is axially aligned with the plurality of light emitters. Thus, the light of the plurality of light emitters can emit through the hub.

In the example, the circuit board includes a plurality of ribs connected to the plurality of light emitters. Thus, the assembly of the fan is fast and convenient, improving the convenience in assembly of the fan.

In the example, the light diffuser ring is made of foggy acrylic (polymethyl methacrylate, PMMA) or polycarbonate (PC). Thus, the light-emitting elements can produce a halo-like light pattern.

In the example, the light diffuser ring includes an inner extension portion extending axially towards the light emitting unit. Thus, the light of the plurality of light-emitting elements can be shone on the inner extension portion to produce a uniform light distribution effect towards the central axis of the light emitting unit.

In the example, the lateral wall portion is axially aligned with and below the light diffuser ring, and the lateral wall portion is not radially aligned with the light diffuser ring. Thus, the light that passes through the light diffuser ring is not obstructed by the lateral wall portion in the radial direction.

In the example, the light diffuser ring includes an inner extension portion and an outer extension portion that extend axially towards the light emitting unit. Thus, the light emitting unit can produce uniform light distribution effect in the axial direction, the radially inward direction, and the radially outward direction.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
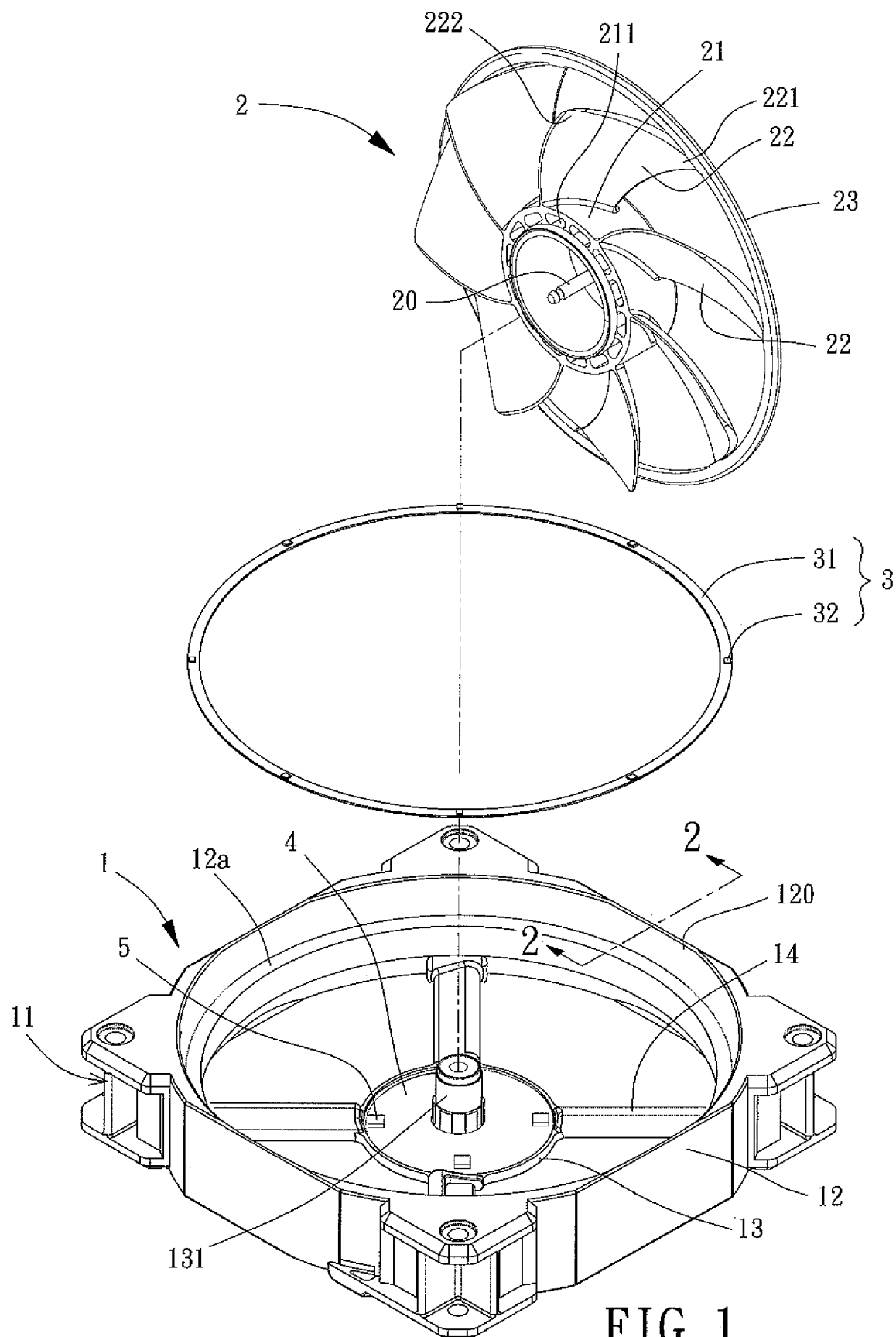
FIG. 1 is an exploded, perspective view of a fan according to a first embodiment of the invention.

In the various figures of the drawings, the same numerals designate the same or similar parts. Furthermore, when the terms "first", "second", "third", "fourth", "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the invention.

DETAILED DESCRIPTION OF THE INVENTION

FIG. 1 shows a fan according to a first embodiment of the invention. The fan includes a fan frame 1, an impeller 2 rotatably mounted in the fan frame 1, and a light emitting unit 3 mounted in the fan frame 1. It is worth mentioning that the invention can be carried out with a blower or an axial fan. In this embodiment, the axial fan is used for illustration purposes, but is not limited thereto.

The fan frame 1 includes a frame portion 11 and a lateral wall portion 12. The frame portion 11 and the lateral wall portion 12 can be integrally formed with each other to increase the structural strength of the fan frame 1. The lateral wall portion 12 preferably includes a desk 12a for mounting purpose of the light emitting unit 3. One side of the desk 12a that is relatively distant to a central axis of the fan frame 1 is provided with a wall 120 to prohibit the light of the light emitting unit 3 from emitting outward in the radial directions. Thus, the light can be concentrated. The fan frame 1 further includes a base 13 mounted in the frame portion 11. A shaft tube 131 is mounted at a center of the base 13. The shaft tube 131 is of any structure that can support the impeller 2 rotating thereupon. In this embodiment, the base 13 is connected to the frame portion 11 or an inner periphery of the lateral wall portion 12 via a plurality of ribs 14, securely mounting the base 13 in the frame portion 11.

Figure 2:
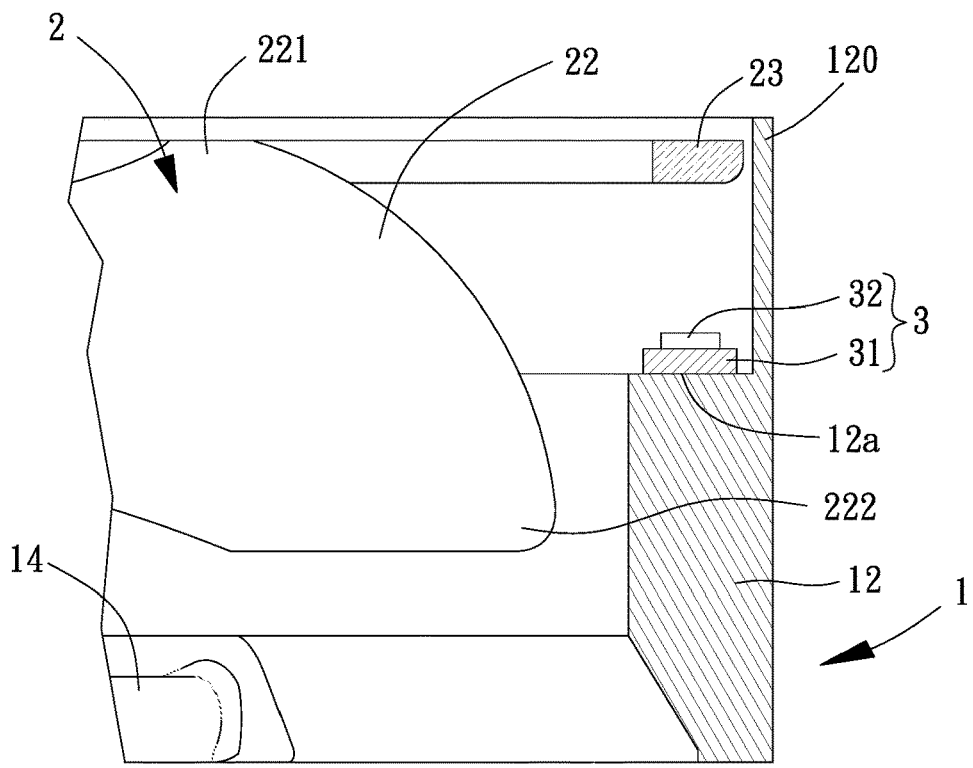
FIG. 2 is a partially sectional view of the fan taken along line 2-2 in FIG. 1.

Referring to FIGS. 1 and 2, the impeller 2 includes a hub 21 coupled with a shaft 20. The hub 21 includes an axially extending portion provided with a light guiding portion 211. The light guiding portion 211 is in the form of an annular groove or a plurality of notches. In this embodiment, the light guiding portion 211 is in the form of a plurality of notches. Thus, it is easier to form the structure of the impeller 2 while increasing the structural strength of the hub 21.

An outer periphery of the hub 21 is provided with a plurality of blades 22. Each of the plurality of blades 22 has an outer edge relatively distant to the shaft 20. The outer edges of the plurality of blades 22 are connected to a light diffuser ring 23. The light diffuser ring 23 is preferably made of foggy acrylic (polymethyl methacrylate, PMMA) or polycarbonate (PC). The outer edge of each blade 22 has an air inlet end 221 and an air outlet end 222. The light diffuser ring 23 is connected to the air inlet ends 221 of the blades 22. The light diffuser ring 23 can be coupled with the blades 22 by ways of adhesion, engagement or screwing. In this embodiment, the hub 21, the blades 22 and the light diffuser ring 23 are preferably connected to each other by integral injection molding, enhancing the structural strength of the impeller 2. In this case, each of the hub 21, the blades 22 and the light diffuser ring 23 is made of foggy acrylic or polycarbonate. The impeller 2 is rotatably coupled with the shaft tube 131 of the base 13 via the shaft 20. The light guiding portion 211 of the hub 21 can be aligned with the base 13. The light diffuser ring 23 can be aligned with the desk 12a of the lateral wall portion 12, such that the light diffuser ring 23 can be located within the axial extent of the lateral wall portion 12 without being located outside of the fan frame 1. This ensures that the axial height of the fan is not increased due to the arrangement of the light diffuser ring 23.

The light emitting unit 3 includes a board 31 that can be disposed on the desk 12a of the lateral wall portion 12. A plurality of light-emitting elements 32 can be mounted on the board 31. The plurality of light-emitting elements 32 can be a plurality of light-emitting diodes (LEDs). The board 31 is in an annular form. The light-emitting elements 32 are preferably located on the board 31 at regular intervals. It is noted that the board 31 can be omitted. In this situation, the light-emitting elements 32 are connected to each other via an electrical wire. The invention is not limited to either option. In this embodiment, the light emitting unit 3 can include the board 31 for convenient assembly. Specifically, since the light diffuser ring 23 is aligned with the desk 12a of the lateral wall portion 12, the light-emitting elements 32 can align with the light diffuser ring 23 axially. This permits the light of the light diffuser ring 23 to emit through the light diffuser ring 23. The light diffuser ring 23 can uniformize the emitted light, producing an appealing visual effect such as a halo-like pattern or different colors of light.

Referring to FIG. 1, the fan according to the invention may further include a circuit board 4 and a plurality of light emitters 5. The circuit board 4 is mounted around the shaft tube 131 of the base 13. The plurality of light emitters 5 can be mounted on the circuit board 4. The hub 21 can be made of foggy acrylic or polycarbonate. The plurality of light emitters 5 can be axially aligned with the light guiding portion 211 of the hub 21 to permit the light emitters 5 to emit light through the hub 21 via the light guiding portion 211. Thus, the emitted light is more uniform. The light emitted through the light diffuser ring 23 by the light-emitting elements 32 and the light emitted through the hub 21 by the light emitters 5 jointly form a double-ring light pattern.

Referring to FIGS. 1 and 2, based on the above structure, the shaft 20 of the impeller 2 can be mounted in the shaft tube 131 of the base 13 in a manner that the light guiding portion 211 of the hub 21 is aligned with the light emitters 5 and the light diffuser ring 23 is aligned with the light-emitting elements 32 of the light emitting unit 3. This permits fast and convenient assembly of the fan, thus improving the convenience in assembly. Furthermore, the light diffuser ring 23 can rotate jointly with the blades 22 during the rotation of the blades 22. In this regard, the light-emitting elements 32 can emit light through the light diffuser ring 23. The light emitted through the light diffuser ring 23 can produce a halo-like pattern as if it was generated in the case of visional persistence. The light distribution of the halo is more uniform.

Figure 3:
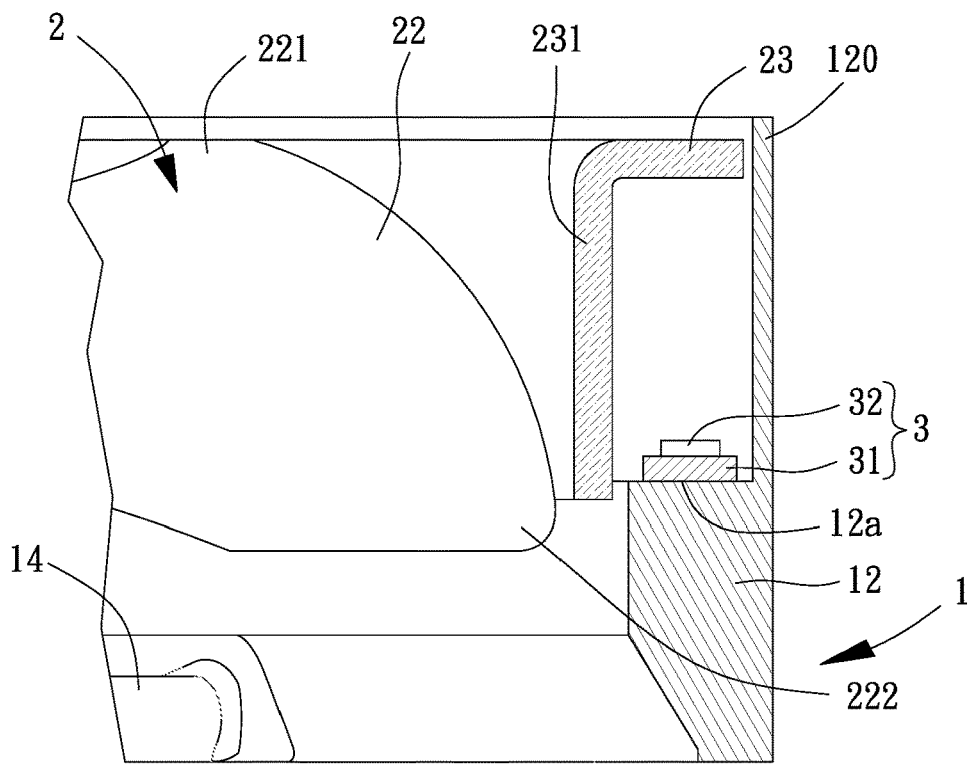
FIG. 3 is a partially sectional view of a fan according to a second embodiment of the invention.

FIG. 3 shows a fan according to a second embodiment of the invention. In this embodiment, the light diffuser ring 23 further includes an inner extension portion 231 substantially extending axially from an inner edge of the light diffuser ring 23 towards the light emitting unit 3. The inner extension portion 231 is preferably coaxial with the lateral wall portion 12 in the area enclosed by the lateral wall portion 12. The bottom edge of the inner extension portion 231 is preferably lower than the desk 12a. In this arrangement, the light of the plurality of light-emitting elements 32 can be shone on both the light diffuser ring 23 and the inner extension portion 231 to uniformly emit through the light diffuser ring 23 and the inner extension portion 231. Advantageously, different types of light effects can be formed.

Figure 4:
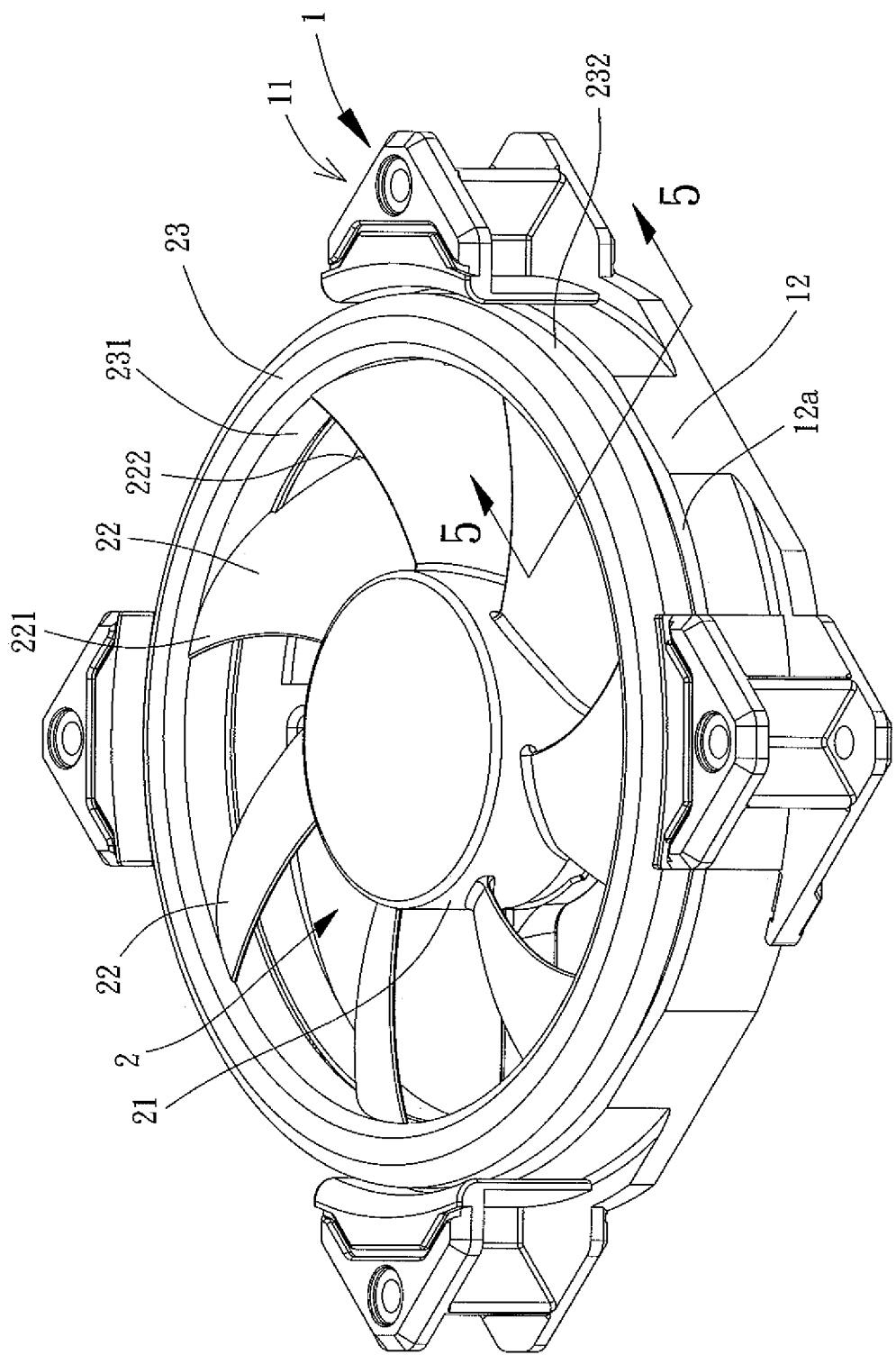
FIG. 4 is a perspective view of a fan after assembly according to a third embodiment of the invention.
Figure 5:
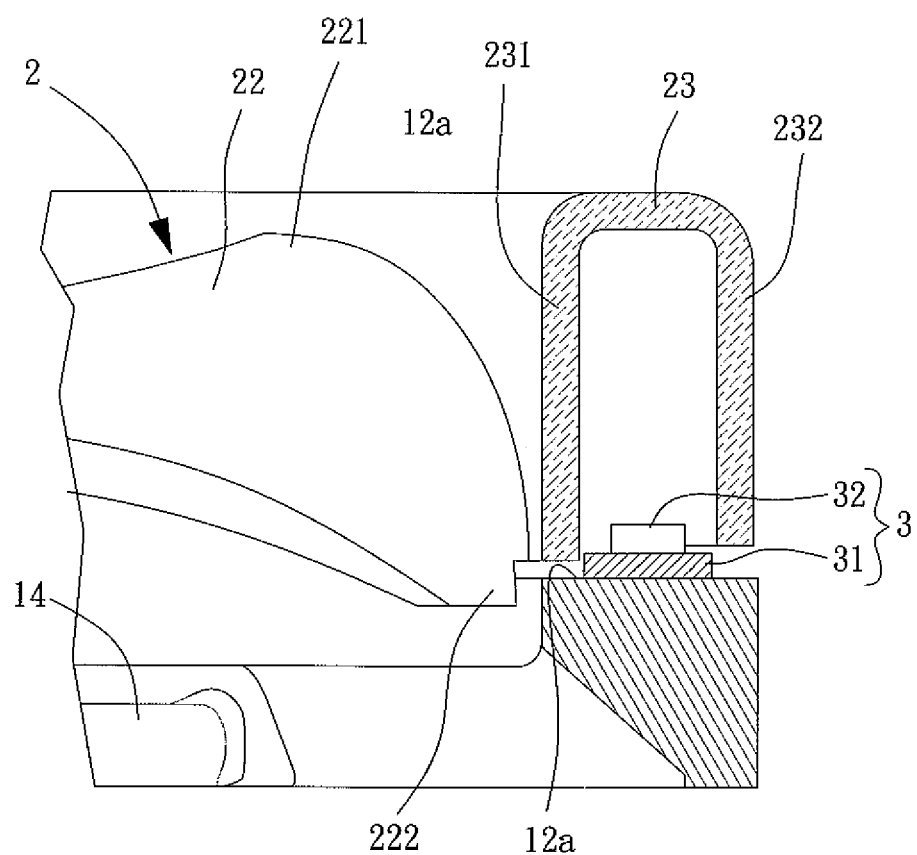
FIG. 5 is a partially sectional view of the fan taken along line 5-5 in FIG. 4.

FIGS. 4 and 5 show a fan according to a third embodiment of the invention. In this embodiment, the lateral wall portion 12 does not include the wall 120 of the first embodiment and the light diffuser ring 23 further includes an outer extension portion 232. The outer extension portion 232 extends from an outer edge of the light diffuser ring 23 towards the light emitting unit 3. In this arrangement, the light diffuser ring 23 is above the lateral wall portion 12 and is not radially aligned with the lateral wall portion 12. Based on this, the area above the lateral wall portion 12 is large enough for accommodating the outer extension portion 232. This reduces the diameter of the fan while permitting the light of the light-emitting elements 32 to shine on the outer extension portion 232, producing outwardly emitted light. As a result, different types of the light effects can be produced.

Figure 6:
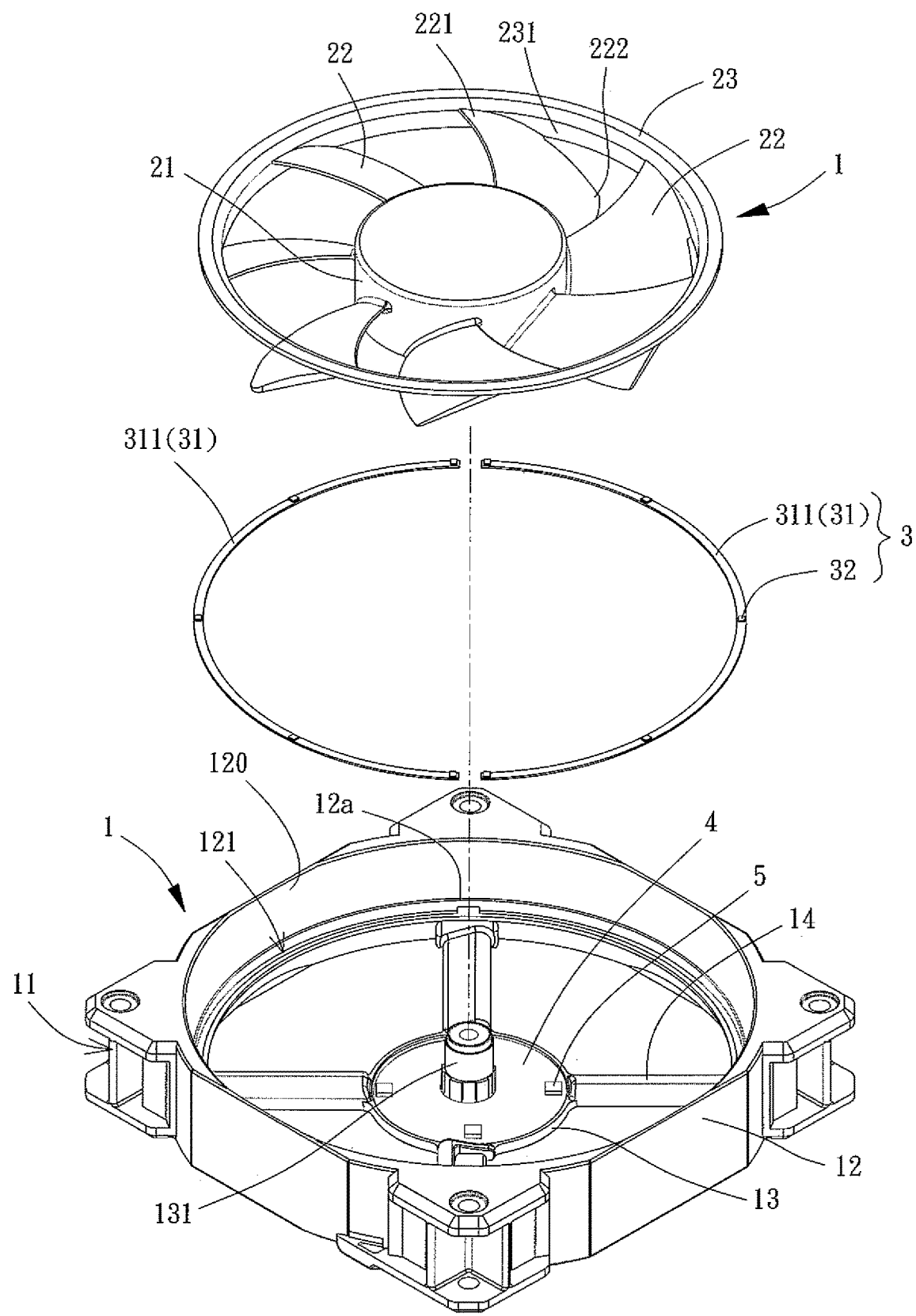
FIG. 6 is an exploded, perspective view of a fan according to a fourth embodiment of the invention.
Figure 7:
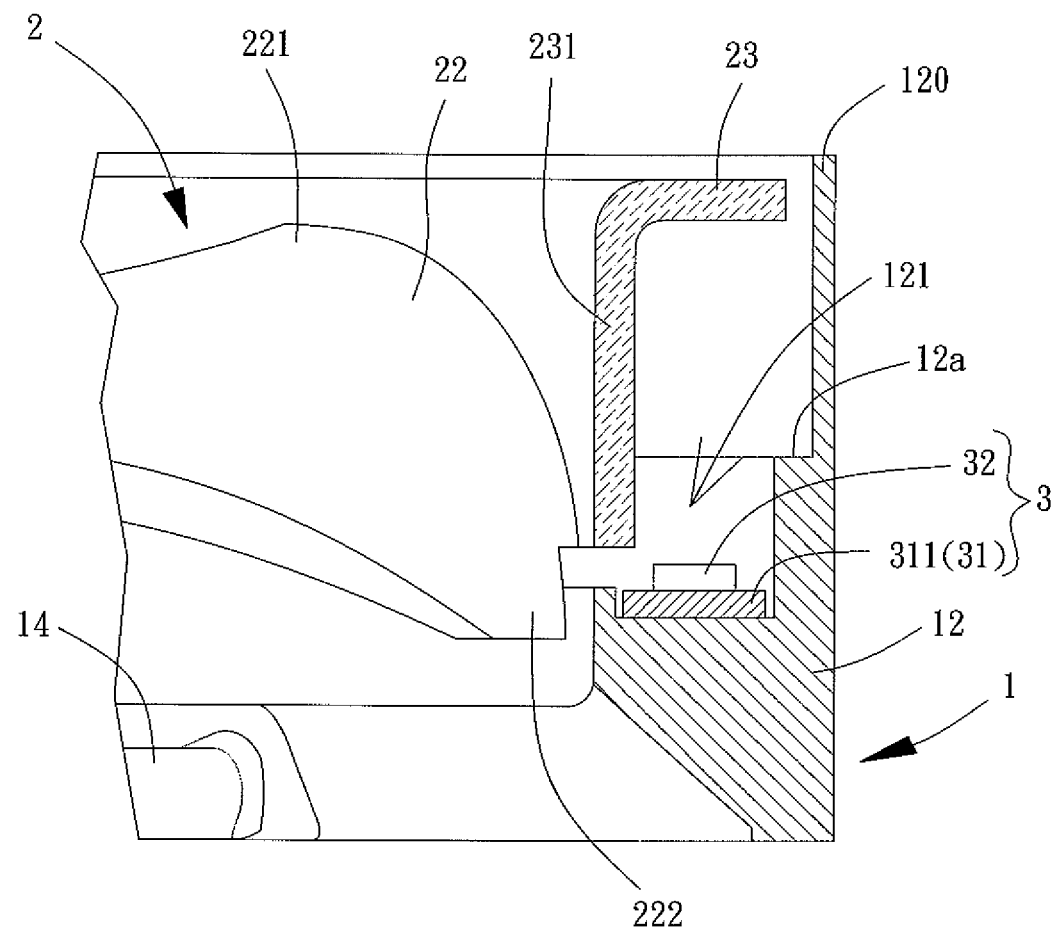
FIG. 7 is a partially sectional, assembled view of the fan of FIG. 6.

FIGS. 6 and 7 show a fan according to a fourth embodiment of the invention. As compared with the second embodiment, the lateral wall portion 12 in this embodiment includes a groove 121 formed on the desk 12a but having a lower level than the desk 12a. The light emitting unit 3 can be received in the groove 121. Specifically, the opening of the groove 121 faces the light diffuser ring 23 such that the groove 121 axially faces the light diffuser ring 23. Accordingly, the light of the light-emitting elements 32 can pass through the groove 121 and is shone on the light diffuser ring 23 and the inner extension portion 231. At the same time, the light of the light-emitting elements 32 will not leak in the radial directions under the obstruction of the wall 120. In this arrangement, the light emitting unit 3 is concealed inside the groove 121 to firmly couple the light emitting unit 3 with the lateral wall portion 12, protecting the light emitting unit 3. Furthermore, in this embodiment, the board 31 of the light emitting unit 3 can be formed by a plurality of arched sections 311. In this arrangement, during the production of the board 31, more arched sections 311 can be produced based on the same area of the material. Advantageously, the manufacturing cost is reduced.

Figure 8:
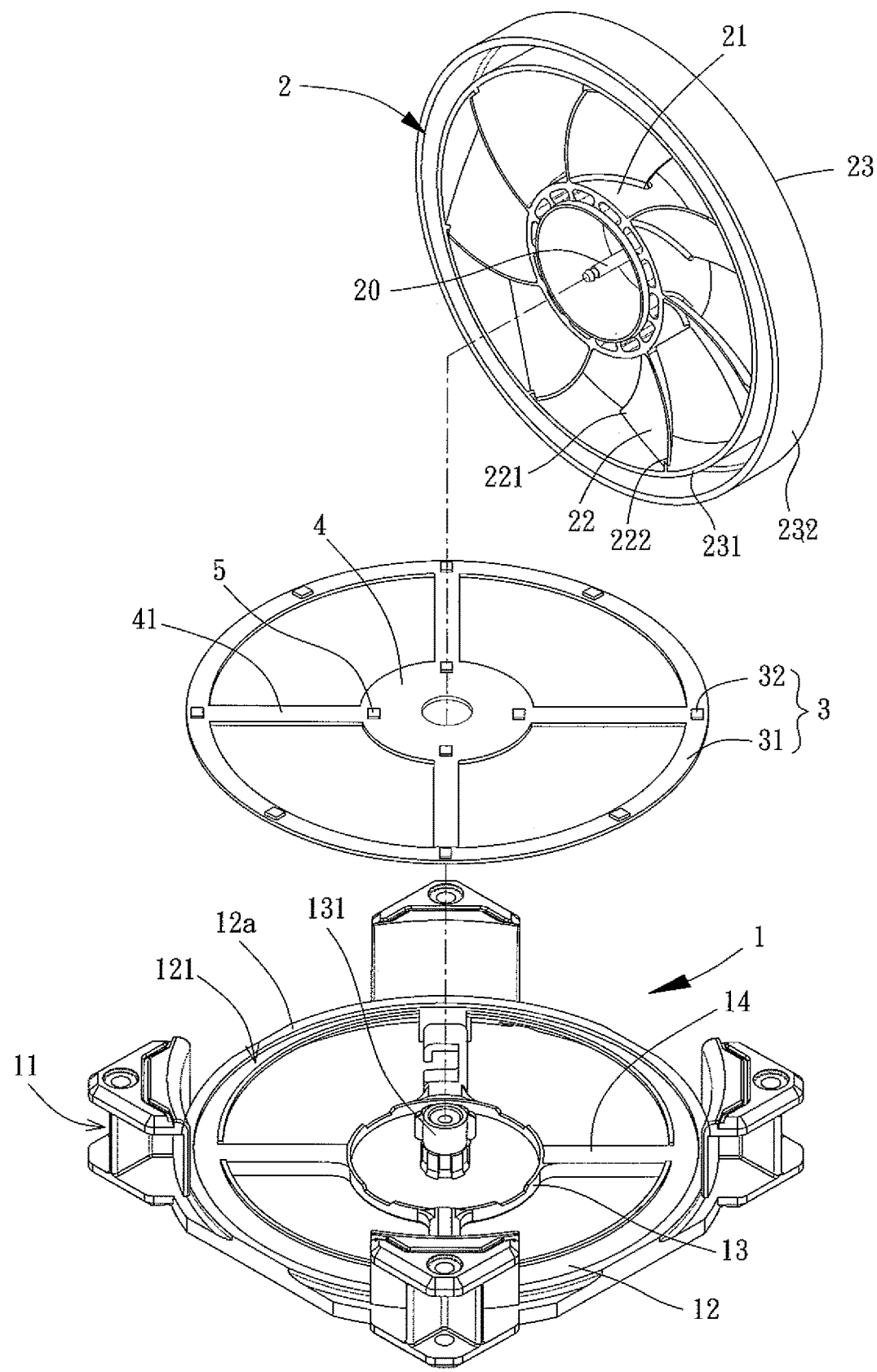
FIG. 8 is an exploded, perspective view of a fan according to a fifth embodiment of the invention.
Figure 9:
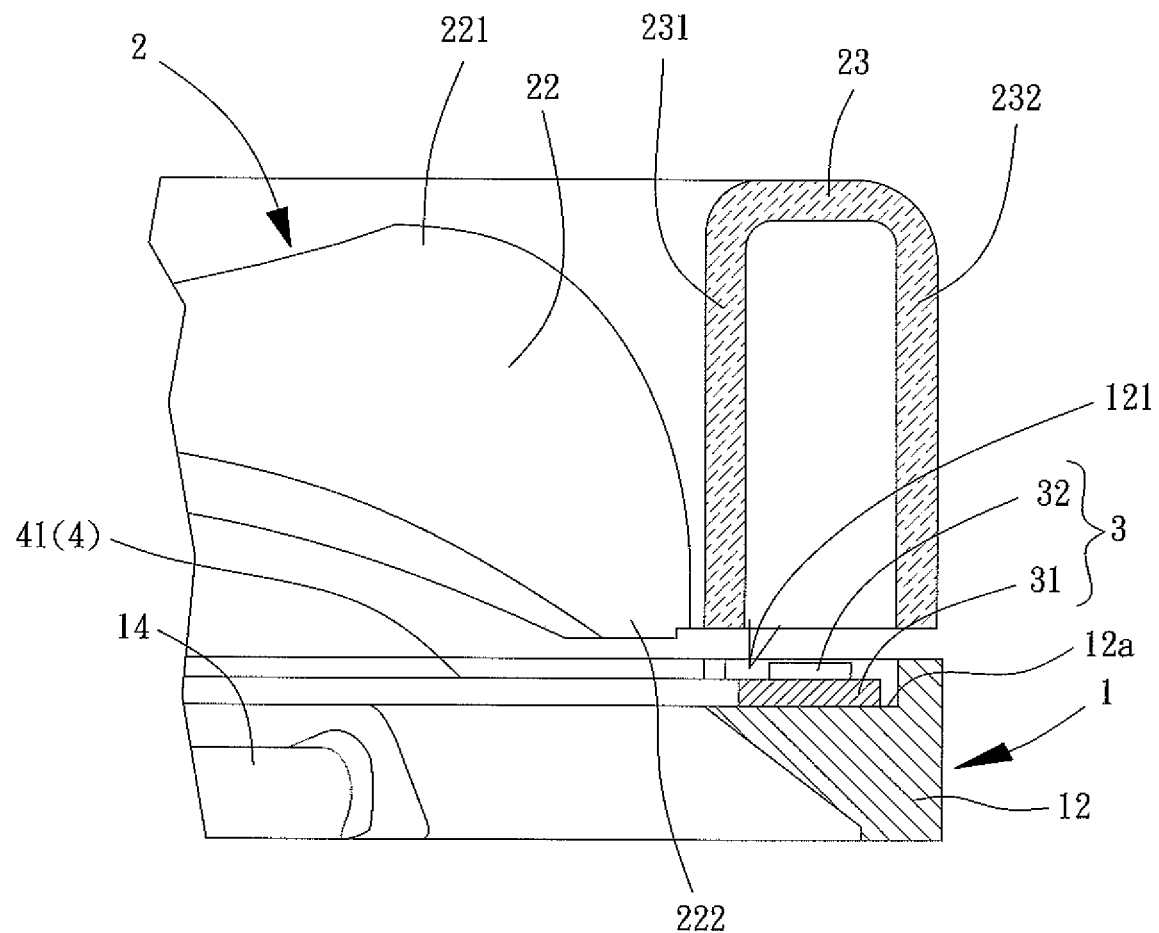
FIG. 9 is a partially sectional, assembled view of the fan of FIG. 8.

FIGS. 8 and 9 show a fan according to a fifth embodiment of the invention. As compared with the fourth embodiment, the lateral wall portion 12 in this embodiment does not include the wall 120 of the fourth embodiment. Thus, the lateral wall portion 12 and the light diffuser ring 23 are not radially aligned with each other, such that the light diffuser ring 23 is above the groove 121. In this arrangement, not only that the light emitting unit 3 can securely couple with the lateral wall portion 12, but also that the light of the light-emitting elements 32 can pass through the groove 121 and can be shone on the light diffuser ring 23, the inner extension portion 231 and the outer extension portion 232. This permits the light to be uniformly emitted through the light diffuser ring 23, the inner extension portion 231 and the outer extension portion 232.

Besides, the circuit board 4 can include a plurality of connecting ribs 41 extending radially outward from the central portion of the circuit board 4. The plurality of connecting ribs 41 is connected to the board 31 of the light emitting unit 3 to interconnect the circuit board 4 and the light emitting unit 3 with each other. Therefore, during the assembly of the fan, the circuit board 4 can be mounted on the base 13 and the connecting ribs 41 are respectively disposed on the ribs 14 to thereby position the light emitting unit 3. Thus, fast and convenient assembly of the fan can be provided, improving the convenience in assembly of the fan.

Figure 10:
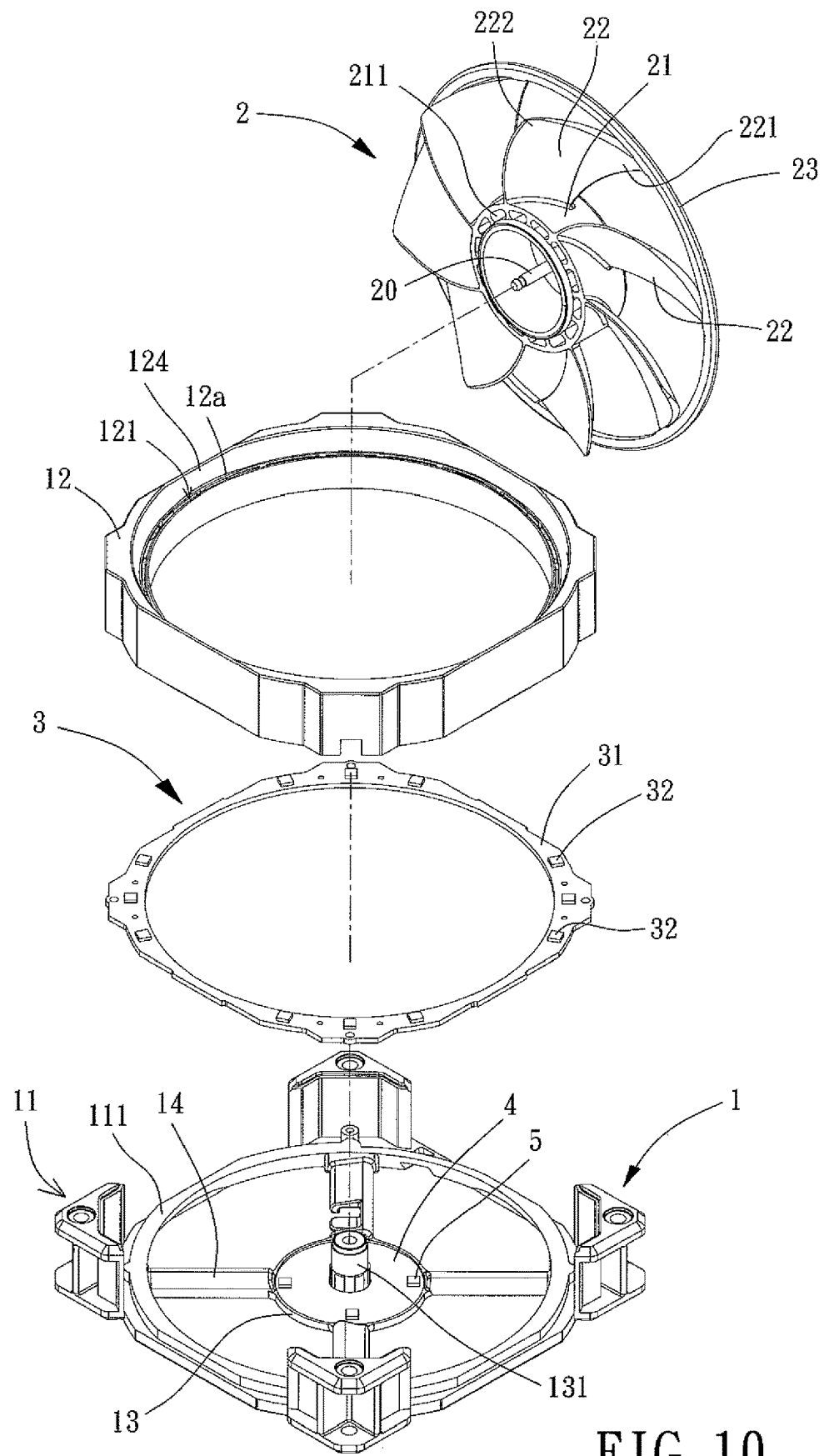
FIG. 10 is an exploded, perspective view of a fan according to a sixth embodiment of the invention.
Figure 11:
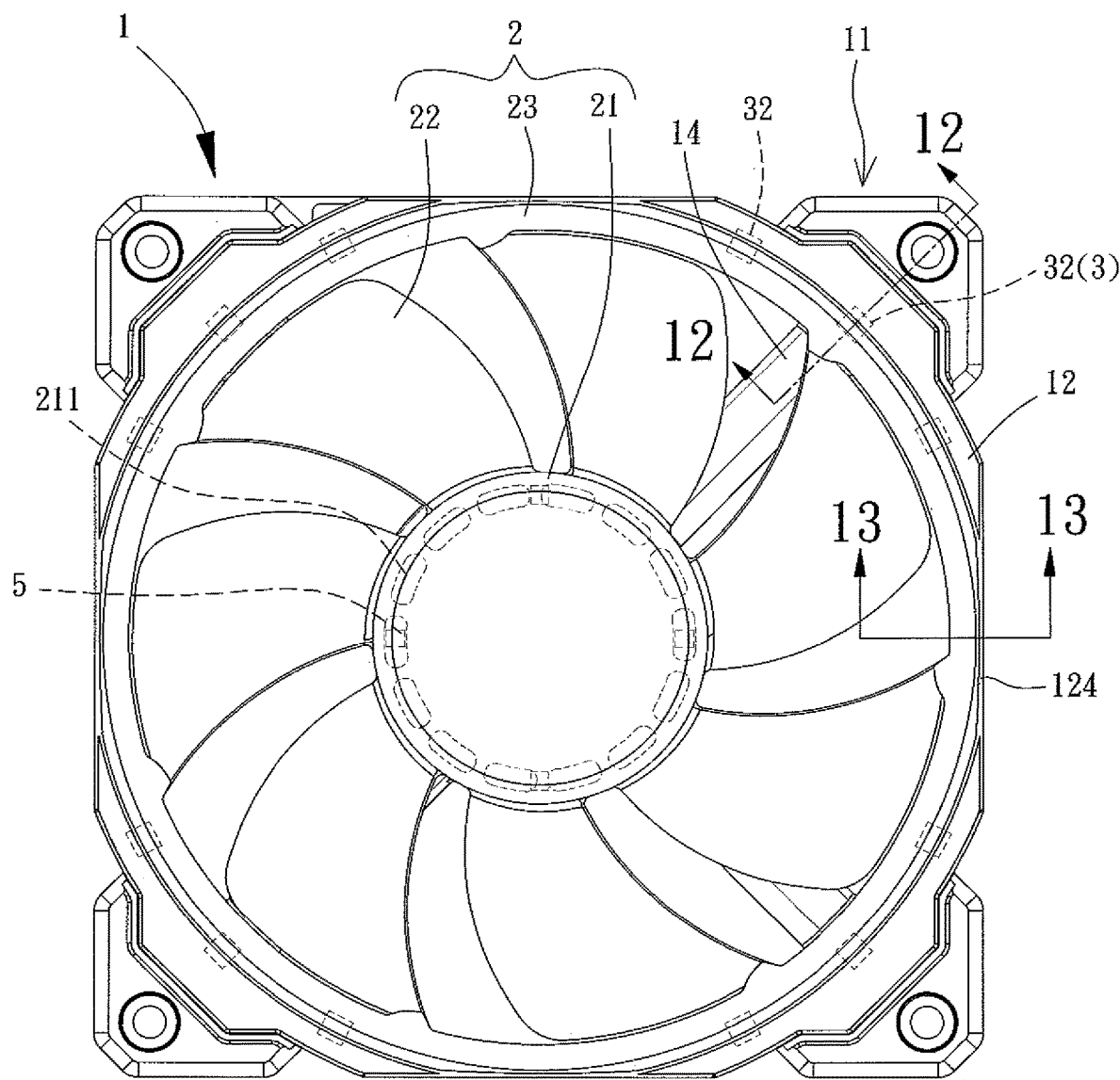
FIG. 11 is a top, assembled view of the fan of FIG. 10.
Figure 12:
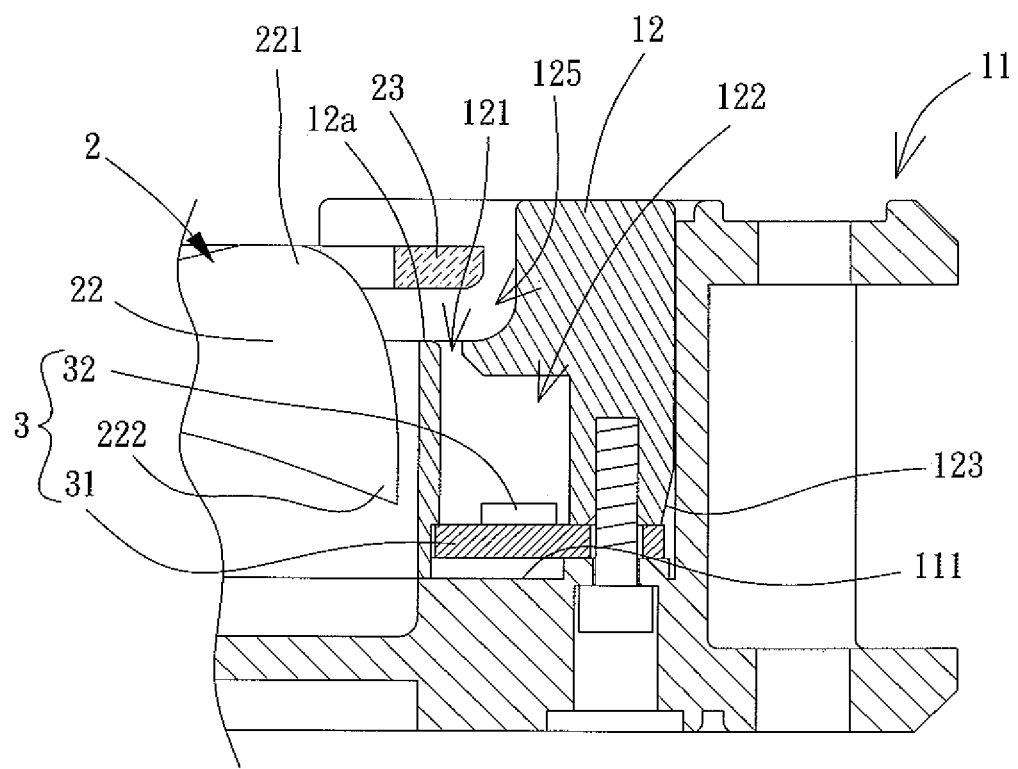
FIG. 12 is a cross sectional view of the fan taken along line 12-12 in FIG. 11.

FIGS. 10, 11 and 12 show a fan according to a sixth embodiment of the invention. In this embodiment, the lateral wall portion 12 is detachably attached to the frame portion 11. The frame portion 11 includes a support portion 111 surrounding the base 13. The plurality of ribs 14 is connected between the base 13 and the support portion 111. The base 13 and the lateral wall portion 12 can be mounted on the support portion 111 in sequence, such that the board 31 is mounted to the frame portion 11 while being located between the lateral wall portion 12 and the frame portion 11.

Specifically, the lateral wall portion 12 includes a hollow portion 122 facing the support portion 111 and intercommunicating with the groove 121. In this regard, the plurality of light-emitting elements 32 can be received in the hollow portion 122 and the light emitting unit 3 can be disposed further into the fan frame 1. The light of the plurality of light-emitting elements 32 can pass through the hollow portion 122 and the groove 121 and then is shone on the light diffuser ring 23. This can avoid excessively high illuminance of the light-emitting elements 32 that is dazzling to the user. Moreover, the size of the groove 121 can be smaller than that of the light diffuser ring 23. Therefore, the light of the plurality of light-emitting elements 32 can be more concentrated. A portion of an outer periphery of the lateral wall portion 12 that corresponds to the board 31 may include a guiding portion 123. The guiding portion 123 can improve the convenience in assembly between the lateral wall portion 12 and the frame portion 11.

Figure 13:
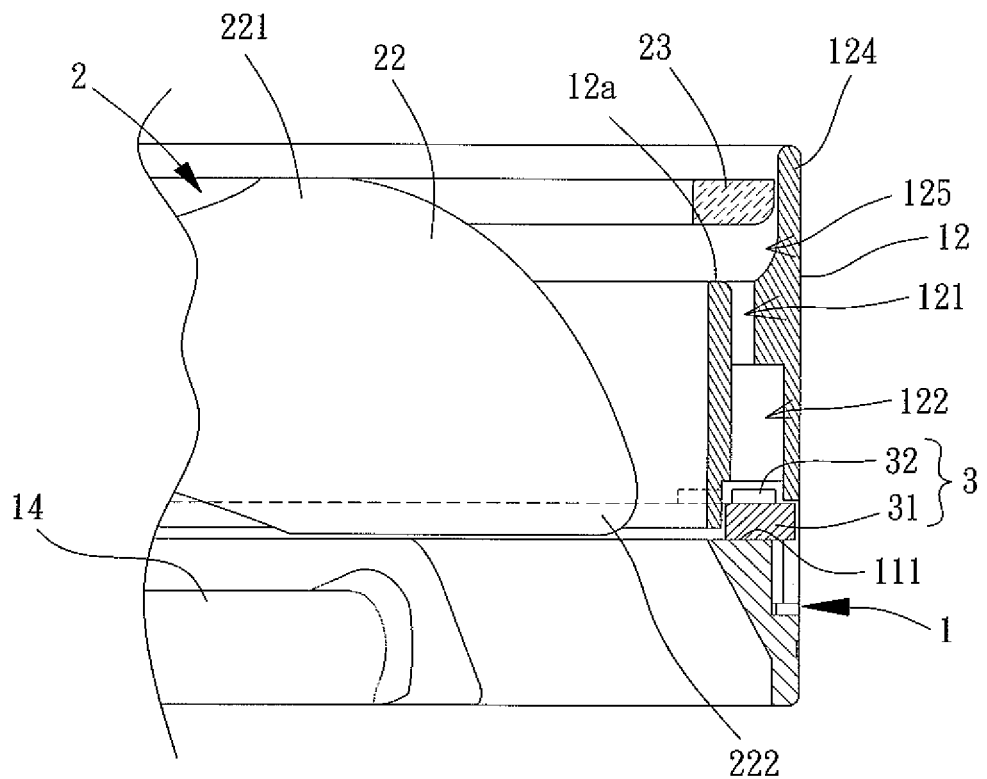
FIG. 13 is a cross sectional view of the fan taken along line 13-13 in FIG. 11.

Referring to FIG. 13, it is noted that the top of the lateral wall portion 12 can include a thin wall portion 124 that delimits an open area 125. The open area 125 intercommunicates with the groove 121. In this regard, the outer edge of the light diffuser ring 23 extends into the open area 125, such that the opening of the groove 121 is completely within the radial extent of the light diffuser ring 23. In this arrangement, after the light of the light emitting unit 3 passes through the hollow portion 122 and the groove 121, the light of the light emitting unit 3 can be completely shone on the light diffuser ring 23, increasing the area of the light that is shone on the light diffuser ring 23.

Figure 14:
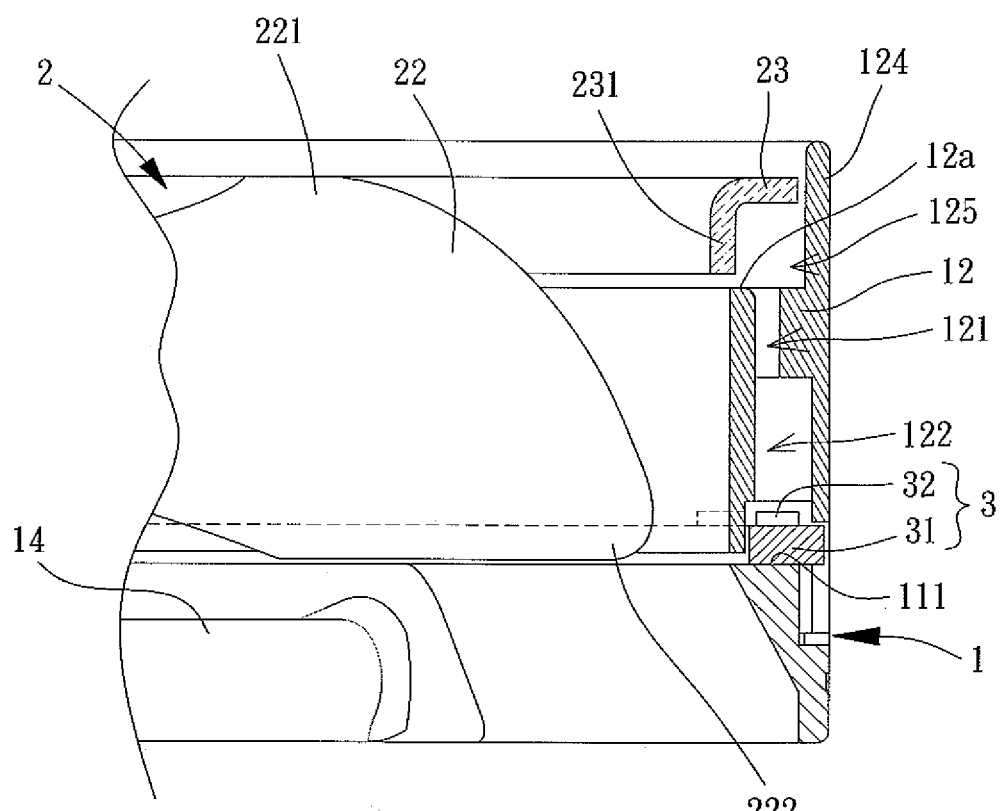
FIG. 14 is a partially sectional, assembled view of a fan according to a seventh embodiment of the invention.

FIG. 14 shows a fan according to a seventh embodiment of the invention. As compared with the sixth embodiment, the light diffuser ring 23 can include an inner extension portion 231 in this embodiment. Accordingly, after the light of the plurality of light-emitting elements 32 of the light emitting unit 3 passes through the hollow portion 122 and the groove 121, the light of the light emitting unit 3 can be shone on the light diffuser ring 23 and the inner extension portion 231. As a result, the light that is shone on the light diffuser ring 23 and the inner extension portion 231 can emit therethrough in a uniform manner, thus providing different types of light effects.

Figure 15:
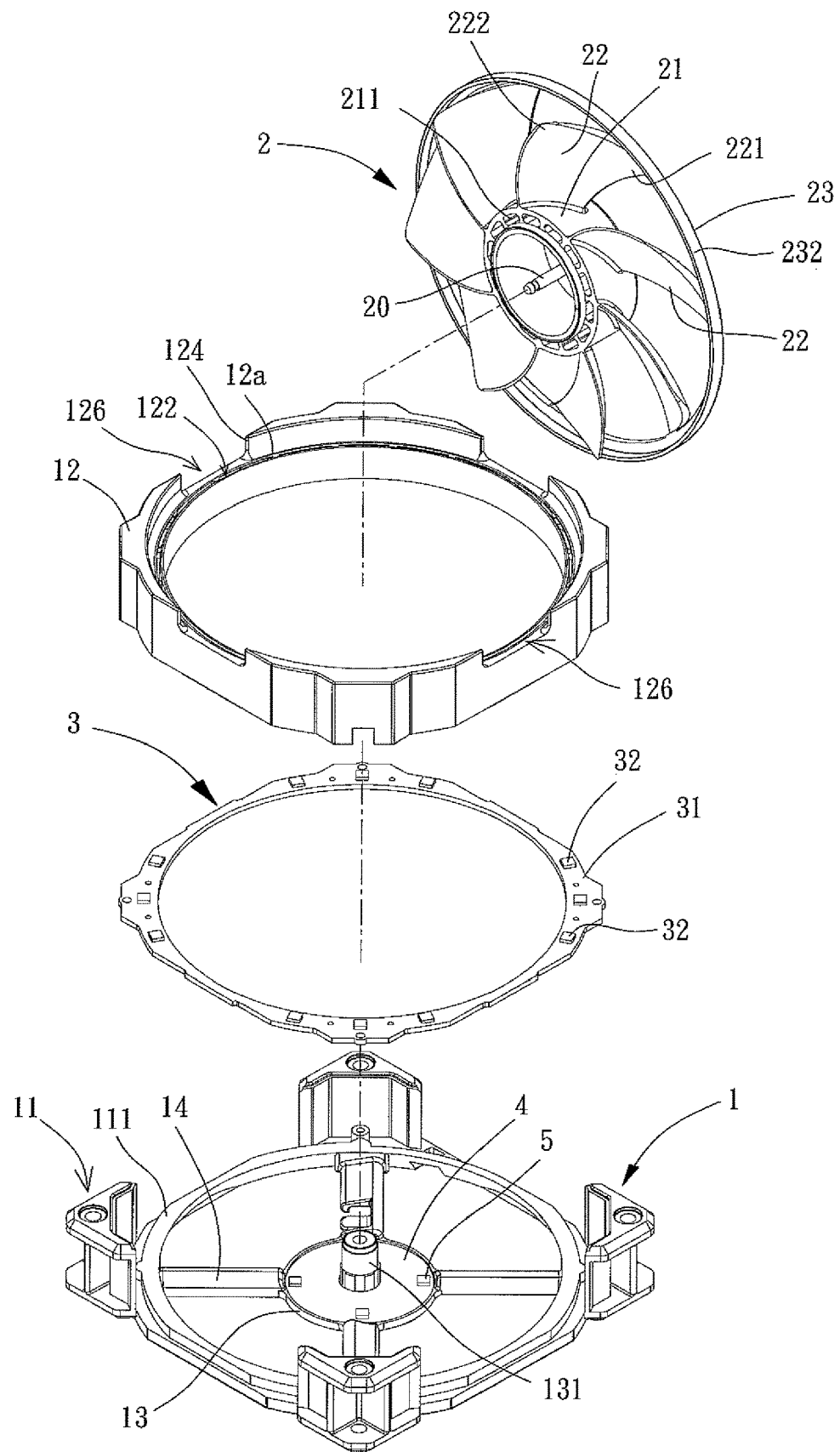
FIG. 15 is an exploded, perspective view of a fan according to an eighth embodiment of the invention.
Figure 16:
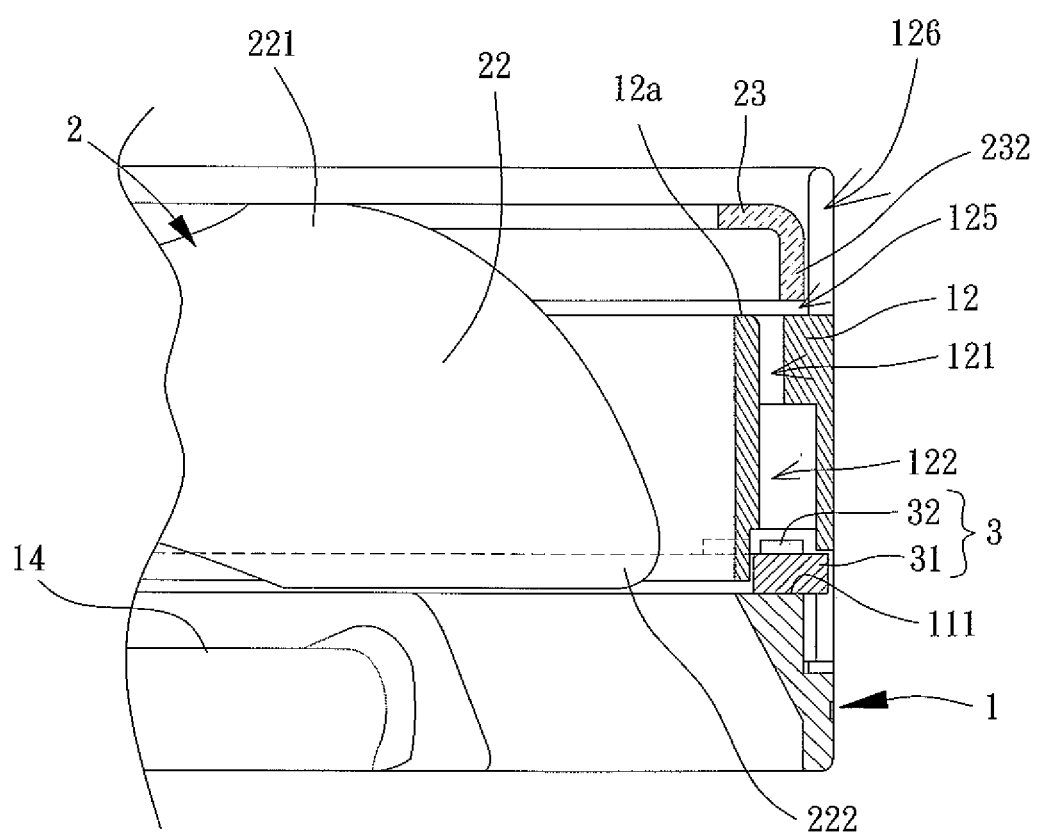
FIG. 16 is a partially sectional, assembled view of the fan of FIG. 15.

FIGS. 15 and 16 show a fan according to an eighth embodiment of the invention. As compared with the sixth embodiment, the thin wall portion 124 may include a plurality of notches 126 in this embodiment. The quantity of the plurality of notches 126 is four in this embodiment. The plurality of notches 126 is arranged in a radially opposing manner. The outer extension portion 232 of the light diffuser ring 23 may align with the plurality of notches 126. Thus, the light of the plurality of light-emitting elements 32 can emit outwards through the outer extension portion 232. In addition, the parts of the thin wall portion 124 not having the plurality of notches 126 will radially cover the outer extension portion 232. As a result, the light of the light diffuser ring 23 cannot emit outward radially under the obstruction of said portions of the lateral wall portion 12. Advantageously, during the rotation of the impeller, the light of the light diffuser ring 23 that passes through the outer extension portion 232 can form a repeated pattern of light of "bright-dark-bright-dark" under the arrangement of the plurality of notches 126 of the thin wall portion 124.

In conclusion, the fan according to the invention provides a convenient and fast assembly by coupling the plurality of blades with the light diffuser ring. The light diffuser ring can be aligned with the light emitting unit 3. During the rotation of the impeller, the light that is emitted through the light diffuser ring can produce a ring-like light pattern as if it was generated in the case of visional persistence. As a result, the light distribution is more visually uniform. This not only improves the convenience in assembly but also brings more business opportunities to the industry while providing a higher utility and a higher aesthetic value.

Although the invention has been described in detail with reference to its presently preferable embodiments, it will be understood by one of ordinary skill in the art that various modifications can be made without departing from the spirit and the scope of the invention, as set forth in the appended claims.

What is claimed is:
1. A fan comprising:
a fan frame including a lateral wall portion, wherein the lateral wall portion includes a groove;
an impeller rotatably coupled with the fan frame and including a light diffuser ring;
a plurality of blades connected to the light diffuser ring; and a light emitting unit mounted in the fan frame and including a board and a plurality of light-emitting elements mounted on the board,
wherein the light emitting unit shines light on the light diffuser ring and emits light through the groove.

2. The fan as claimed in claim 1, wherein the fan frame includes a frame portion integrally formed with the lateral wall portion.

3. The fan as claimed in claim 2, wherein the board is mounted on a desk of the lateral wall portion.

4. The fan as claimed in claim 1, wherein the groove and the light diffuser ring are axially aligned with each other.

5. The fan as claimed in claim 1, wherein the light diffuser ring is within an axial extent of the lateral wall portion.

6. The fan as claimed in claim 1, wherein the fan frame includes a frame portion connected to the lateral wall portion, and wherein the board of the light emitting unit is mounted to the frame portion and is located between the lateral wall portion and the frame portion.

7. The fan as claimed in claim 6, wherein the board of the light emitting unit is formed by a plurality of arched sections.

8. The fan as claimed in claim 6, wherein the frame portion includes a support portion, and wherein the board of the light emitting unit is mounted on the support portion.

9. The fan as claimed in claim 6, wherein the lateral wall portion includes a hollow portion facing the plurality of light-emitting elements and intercommunicating with the groove, and wherein the plurality of light-emitting elements is received in the hollow portion.

10. The fan as claimed in claim 1, wherein the groove is formed on the lateral wall portion and includes an opening facing the light diffuser ring, and wherein the light emitting unit is received in the groove.

11. The fan as claimed in claim 1, wherein a top of the lateral wall portion includes a thin wall portion delimiting an open area, wherein the open area intercommunicates with the groove, wherein an outer edge of the light diffuser ring extends into the open area, and wherein the groove includes an opening completely within a radial extent of the light diffuser ring.

12. The fan as claimed in claim 1, wherein the fan frame includes a frame portion, a base and a plurality of ribs 14, wherein the base is received in the frame portion, wherein the frame portion includes a support portion surrounding the base, and wherein the plurality of ribs are connected between the base and the support portion.

13. The fan as claimed in claim 12, further comprising a circuit board and a plurality of light emitters mounted on the circuit board, wherein the circuit board is mounted on the base, wherein the impeller includes a hub connected to the plurality of blades, and wherein the hub is light-permeable and is axially aligned with the plurality of light emitters.

14. The fan as claimed in claim 13, wherein the circuit board includes a plurality of connecting ribs connected to the light emitting unit.

15. The fan as claimed in claim 1, wherein the light diffuser ring is made of foggy acrylic (polymethyl methacrylate, PMMA) or polycarbonate (PC).

16. The fan as claimed in claim 1, wherein the light diffuser ring includes an inner extension portion extending axially towards the light emitting unit.

* * * * *